United States Patent [19]

Chiba et al.

[11] 4,323,639

[45] Apr. 6, 1982

[54] PHOTOSENSITIVE POLYAMIDE RESIN COMPOSITION

[75] Inventors: Kazumasa Chiba, Nagoya; Keiichi Egawa, Otsu; Toshio Muraki, Nagoya, all of Japan

[73] Assignee: Toray Industries, Inc., Tokyo, Japan

[21] Appl. No.: 202,381

[22] PCT Filed: Nov. 30, 1979

[86] PCT No.: PCT/JP79/00307

§ 371 Date: Jul. 24, 1980

§ 102(e) Date: Jul. 24, 1980

[87] PCT Pub. No.: WO80/01212

PCT Pub. Date: Jun. 12, 1980

[30] Foreign Application Priority Data

Dec. 1, 1978 [JP] Japan ............................. 53/147833
Dec. 13, 1978 [JP] Japan ............................. 53/153139

[51] Int. Cl.³ ............................................. G03C 1/68
[52] U.S. Cl. ................................. 430/281; 430/283; 430/300; 430/306; 204/159.15; 204/159.18; 528/335
[58] Field of Search ............... 430/283, 270, 300, 281, 430/306; 528/335; 204/159.15, 159.18

[56] References Cited

U.S. PATENT DOCUMENTS 3,486,903 12/1969 Henkler .............................. 96/115
3,551,148 12/1970 Fauchaber et al. ................ 430/283
3,882,090 5/1975 Fagerburg et al. ................ 528/335

FOREIGN PATENT DOCUMENTS 4565400 9/1967 Japan.
44-28727 11/1969 Japan.

Primary Examiner—Jack P. Brammer
Attorney, Agent, or Firm—Austin R. Miller

[57] ABSTRACT

A photosensitive resin composition comprising a polyamide containing 10 to 70% by weight of a polyoxyethylene segment or poly(oxyethylene/oxypropylene) copolymer segment having a number average molecular weight of from 150 to 1,500 in its molecular chain, and a photopolymerizable unsaturated compound. This composition exhibits excellent flexibility and water- and alcohol-developability, and results in a printing plate exhibiting excellent transparency, toughness and printing durability.

5 Claims, No Drawings

PHOTOSENSITIVE POLYAMIDE RESIN COMPOSITION

TECHNICAL FIELD

The present invention relates to a photosensitive polyamide resin composition. More particularly, the present invention relates to a highly efficient photosensitive polyamide resin composition comprising a polyamide containing a polyoxyethylene segment or a poly(oxyethylene/oxypropylene) copolymer segment in combination with a photo-polymerizable unsaturated compound and, if necessary, a photosensitizer and a thermal polymerization inhibitor.

BACKGROUND OF THE ART

A photosensitive polyamide resin composition comprising a soluble polyamide, a photopolymerizable unsaturated compound and, if necessary, a photo polymerization initiator, and which is capable of being insolubilized under the action of a light has been heretofore used as a material for a printing plate (a relief or lithography), a photoresist, a photosensitive paint and a display, and as an image forming material. For example, a printing relief is produced by exposing a photosensitive layer of a plate comprising a support with a photosensitive resin composition deposited thereon to rays through a negative or positive film having a transparent image area, hardening the photosensitive resin composition of the exposed areas and insolubilizing it, and dissolving out the photosensitive resin composition of the unexposed areas with a suitable solvent. The polymer which constitutes a basic component of such a photosensitive polyamide resin composition should satisfy a number of requirements: it should be soluble in a suitable solvent, but when it is exposed to a light, the polyamide resin should become insoluble in the solvent due to polymerization of the photopolymerizable unsaturated compound; it should be sufficiently compatible with the photopolymerizable unsaturated compound and the other various additives so as to form a uniform mixture thereof, and; it should exhibit a high mechanical strength, and excellent transparency and durability. In recent years, photosensitive resin compositions have found a wider field of application. For this purpose, the basic polyamide should satisfy additional requirements. That is, the basic polyamide should exhibit satisfactory flexibility, water-developability, toughness, smoothness and printing durability. Under these circumstances, there is a strong desire for a highly efficient photosensitive polyamide resin composition capable of satisfying the above-mentioned requirements.

DISCLOSURE OF THE INVENTION

As a basic polyamide for the photosensitive resin composition, there have been heretofore proposed an alcohol-soluble polyamide copolymer (e.g. Japanese Patent Application Publication Nos. 35-14719 and 45-7330), a polyamide containing an ether linkage (e.g. Japanese Patent Application Publication No. 49-43565 and Japanese Patent Application Laid-open No. 48-42049), a polyamide containing a basic nitrogen (e.g. Japanese Patent Application Laid-open No. 50-7605), a polyamide containing an ammonium salt type nitrogen atom (e.g. Japanese Patent Application Laid-open No. 53-36555) and a polyamide containing a sulphonate group (e.g. Japanese Patent Application Laid-open No. 49-76602).

The inventors have paid attention to the fact that the polyamide containing an ether linkage exhibits excellent flexibility and is highly soluble in water or an alcohol, and further, it is very tough, so that they have conducted detailed examinations on the polyamide. As a result, the inventors have found that a printing plate prepared by using a polyamide containing, as one component, a relatively low molecular weight compound containing an oxyethylene linkage, which is disclosed in the above-mentioned prior art, can indeed be developed with water or an alcohol and the developed printing plate exhibits a relatively high mechanical strength, and an excellent flexibility. However, the inventors have also found that the above-mentioned printing plate can not satisfactorily meet the requirements for a practical printing plate.

The inventors have conducted extensive studies on a polyether-amide type photosensitive resin composition capable of providing a printing plate which is more flexible and exhibits an excellent water- or alcohol-developability, and excellent transparency, toughness and printing durability. As a result, the inventors have found that a composition comprising a polyamide containing a polyoxyethylene segment or poly(oxyethylene/oxypropylene) copolymer segment having a relatively high molecular weight, as a basic polymer, and a photopolymerizable unsaturated compound, and if necessary, a photo-sensitizer and a thermal polymerization inhibitor, exhibits very excellent properties. Thus, the inventors attained the present invention.

That is, the present invention provides a photosensitive polyamide resin composition comprising a polyamide containing 10 to 70% by weight of a polyoxyethylene segment or poly(oxyethylene/oxypropylene) copolymer segment having a number average molecular weight of from 150 to 1,500 in its molecular chain, a photopolymerizable unsaturated compound, and if necessary, a photo-sensitizer and a thermal polymerization inhibitor.

BEST MODE FOR THE PRACTICE OF THE INVENTION

A feature of the present invention resides in the discovery that by using a polyamide containing the above-specified amount of a polyoxyethylene segment or poly(oxyethylene/oxypropylene) copolymer segment having the above-specified molecular weight, it is possible to obtain a polyetheramide type photosensitive resin composition in which its compositional components are highly compatible with each other; that from the composition a printing plate excellent in transparency and storageability can be prepared, which exhibits a high rate of development with water or an alcohol in the production of a printing relief and reproduces accurately the fine lines or small spots of a negative film on the relief, and; that such a printing plate is very efficient and exhibits such desirable properties as excellent flexibility, toughness and flatness.

The term "polyamide containing, in its molecular chain, a polyoxyethylene segment or poly(oxyethylene/oxypropylene) copolymer segment", as used herein, refers to a polyamide containing, as its structural units, a unit derived from a polyoxyethylene or poly(oxyethylene/oxypropylene) copolymer having an amino or carboxyl group in the terminal end thereof and conventional aliphatic, alicyclic or aromatic dicarboxylic acids or diamines, such as oxalic acid, succinic acid, glutaric acid, adipic acid, pimelic acid, suberic acid, azelaic acid, sebacic acid, dodecadionic acid, diglycolic acid, 1,4-cyclohexane dicarboxylic acid, terephthalic acid, isophthalic acid, 5-sodium sulfoisophthalic acid, ethylenediamine, trimethylenediamine, tetramethylenediamine, hexamethylenediamine, undecamethylenediamine, dodecamethylenediamine, 2,2,4/2,4,4-trimethylhexamethylenediamine, 1,3-and 1,4-bis(aninomethyl) cyclohexane, bis(4,4'-aminocyclohexyl) methane, and meta- and para-xylylenediamine. It is necessary that the polyoxyethylene segment or poly(oxyethylene/oxypropylene) copolymer segment contained in the polyamide have a number average molecular weight of from 150 to 1,500, preferably, from 180 to 1,200. When the number average molecular weight is less than 150, the resulting printing plate is relatively poor in flexibility and toughness. On the other hand, in a case where the number average molecular weight of the polyoxyethylene segment or poly(oxyethylene/oxypropylene) copolymer segment exceeds 1,500, the resulting printing plate is inferior in transparency, and can not retain the characteristics inherent in the polyamide, so that the image on the surface of the plate becomes swollen when a printing ink is applied thereon and the printing surface exhibits a poor durability to repeated printing operations. Therefore, such a printing plate is unsuitable as a practical printing plate. Also, it is necessary that the content of the polyoxyethylene segment or poly(oxyethylene/oxypropylene) copolymer segment in the polyamide be in the range of from 10 to 70% by weight. In order to obtain an excellent water-developability, it is preferable that the content of the segment be in the range of from 30 to 70% by weight, particularly, from 40 to 70% by weight. When the content of the segment is less than 10% by weight, the resulting printing plate exhibits poor developability and flexibility, and thus, it is of no practical use. On the other hand, in a case where the content of the polyoxyethylene segment or poly(oxyethylene/oxypropylene) copolymer segment exceeds 70% by weight, the resultant printing plate is remarkably inferior in mechanical strength and printing durability. More preferably, it is desirable that the polyamide of the present invention have a ratio of O/N of 1.0 or more (the O/N means a ratio of the number of oxygen atoms forming ether linkages to the number of nitrogen atoms forming polyamide linkages of the main chain). When the ratio of O/N is less than 1.0, it is difficult to obtain a printing plate which satisfies the required levels of transparency and flexibility for practical purposes. The upper limit of the O/N ratio is not particularly restricted to a specified value. However, it is generally on the order of 4.0 in the sense that the characteristics as a polyamide type resin composition must be retained. The polyoxyethylene or poly(oxyethylene/oxypropylene) copolymer containing an amino or carboxyl group in the terminal end thereof which may be used in the present invention can be prepared from a polyethylene glycol or poly(ethylene/propylene) glycol by using a conventional process in which the terminal hydroxyl group of the polyethylene glycol or poly(ethylene/propylene) glycol is converted into an amino or carboxyl group. The poly(oxyethylene/oxypropylene) copolymer segment may consist of a random copolymer or block copolymer which is composed of an oxyethylene unit and an oxypropylene unit. The ratio of oxyethylene unit to oxypropylene unit in the poly(oxyethylene/oxypropylene) copolymer segment is not particularly limited to a specified range and it may be of any value. However, if the water-developability of the resultant printing plate is to be enhanced, it is preferable that the oxyethylene unit have a relatively high content, particularly, a content of at least 50% by mole.

The polyamide usable for the present invention may be a homopolymer which is a salt of a polyoxyethylene or a poly(oxyethylene/oxypropylene) copolymer containing an amino or carboxyl group in the terminal end thereof and a conventional aliphatic, alicyclic or aromatic dicarboxylic acid or diamine as described above. The polyamide may also be a copolymer comprising the above-mentioned polyoxyethylene or poly(oxyethylene/oxypropylene) copolymer with which any other amide forming component is copolymerized. In this case, the copolymerizable component is not particularly critical and may be any known comonomer, such as lactams, for example, ε-caprolactam, and ω-laurolactam; amino acids, for example, 6-aminocaproic acid, 11-aminoundocanoic acid and 12-amino-decanoic acid, and; salts derived from a combination of the above-mentioned aliphatic, alicyclic or aromatic dicarboxylic acids and diamines. The polyamide may be prepared by a conventional polymerization method such as melt polymerization, interfacial polymerization, solution polymerization, bulk polymerization, solid phase polymerization and combinations thereof. Generally, the melt polymerization method is most preferable.

The photopolymerizable unsaturated compound usable for the present invention is a compound containing, in its molecule, at least one unsaturated group represented by the formula: $CH_2=C<$. Examples of such a compound are:

(1) acrylic and methacrylic esters of glycol, trimethylolpropane, pentaerythritol and polyether containing at least two hydroxyl groups in the molecule, such as triethylene glycol dimethacrylate, polyethers containing an acryloyl or methacryloyl group in their side chain, which are obtained from glycidyl acrylate or methacrylate, and pentaerythritol acrylate;

(2) unsaturated compounds prepared from the addition reaction of glycidyl methacrylate and compounds containing an active hydrogen, for example, a methacrylic ester having the structure:

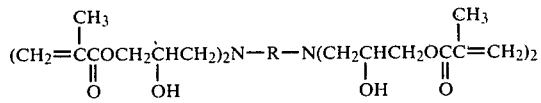

wherein R represents an alkylene, xylylene, cyclohexylene or phenylene;

(3) bisacrylamides or bismethacrylamide which are derived from diamino compounds, such as N,N'-methylene bisacrylamide, N,N'-m-phenylene bisacrylamide, diacrylamide-N-methyl ether, and N,N'-hexamethylene bisacrylamide, and;

(4) reaction products of glycidyl ethers of polyhydric alcohols and acrylic acid or methacrylic acid, for example, a methacrylic ester having the structure:

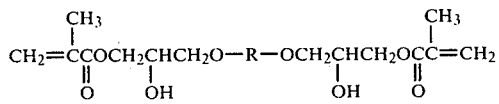

wherein R represents a polyalkylene glycol residue having from 2 to 5 carbon atoms.

In addition to the compounds containing at least two unsaturated groups having the formula $CH_2=C>$ in the molecule, there may also be used monofunctional unsaturated compounds of:

(5) acrylamide, methacrylamide and derivatives thereof, methacrylamide, N-methylolacrylamide, N-methylolacrylamide butyl ether, diacetone acrylamide, etc;

(6) glycidyl acrylate and glycidyl methacrylate, and;

(7) oxyalkyl acrylates, halooxyalkyl acrylates, oxyalkyl methacrylates and halooxyalkyl methacrylates, such as methacrylic acid 3-chloro-2-oxypropyl.

The unsaturated compounds may be used singly or in mixtures of two or more of the above-mentioned compounds. It is suitable if the photopolymerizable unsaturated compound is used in an amount of, usually, from 5 to 200% by weight, preferably, from 10 to 150% by weight, based on the weight of the polyamide in the photosensitive resin composition. In the case where the amount of unsaturated compound used is less than 5% by weight, the resulting printing plate is disadvantageous in that the exposed area can not be insolubilized to a satisfactory extent. On the other hand, when the unsaturated compound is used in an amount exceeding 200% by weight, the resulting printing plate exhibits a poor mechanical strength.

The photosensitizer which is used in the present invention is added for the purpose of promoting the polymerization of the above-mentioned photopolymerizable compound in the polyamide matrix. The photosensitizer may be selected from conventional photosensitizer compounds. Examples of such compounds are benzophenone and derivatives thereof, benzoin and derivatives thereof, anthraquinone and derivatives thereof, halogen-containing compounds and sulfur-containing compounds. The amount of photosensitizer used is not particularly critical. However, usually, it is preferable that the photosensitizer is used in an amount of from 0.01 to 5% by weight, based on the total weight of the polyamide and the photopolymerizable unsaturated compound.

The thermal polymerization inhibitor which is used in the present invention is added for the purpose of preventing the thermal polymerization of the unsaturated compounds due to the heating operation during the preparation, molding and processing of the photosensitive resin composition, or the radical reaction of the unsaturated compounds during the storage of the photosensitive resin composition. The thermal polymerization inhibitor may be selected from conventional polymerization inhibitors, such as hydroquinone and derivatives thereof, phenol and derivatives thereof, aromatic amine compounds, nitroso compounds, sulfur-containing compounds and triphenylphosphine. The amount of thermal polymerization inhibitor used is not particularly critical. However, it is preferable that the thermal polymerization inhibitor is used in an amount of from 0.001 to 5% by weight, based on the total weight of the polyamide and the photopolymerizable unsaturated compound.

The composition of the present invention may have incorporated therein other additives, such as stabilizers, plasticizers, dyes and pigments, provided that they have no adverse effect on the photosensitivity, developability and other physical properties of the resulting composition.

The photosensitive polyamide resin composition of the present invention which comprises the polyamide containing a polyether segment in its molecular chain, the photopolymerizable unsaturated compound, the photosensitizer and the thermal polymerization inhibitor is usually shaped into a sheet-like material and the resultant sheet-like material is subsequently used as a photosensitive resin plate that is, the photosensitive polyamide resin composition is shaped into a sheet-like material having a desired thickness, such as sheets, films and foils, by a conventional shaping method, such as a hot press, casting, calendering, coating and melt extrusion, and; the resultant sheet-like material is laminated onto a substrate with or without an adhesive, thereby to form a photosensitive resin plate. Alternatively, a solution of the photosensitive polyamide resin composition in any suitable solvent is cast on a substrate, thereby to form a photosensitive resin plate. The substrate usable for the present invention may be selected from a steel plate, an aluminum plate, an iron plate, a glass plate and a plastic film. When a negative or positive film having a transparent image is tightly superposed on the photosensitive layer of the photosensitive resin plate as prepared above and the photosensitive resin plate is irradiated with actinic rays from above the film, only the exposed area is insolubilized and hardened. As a source of actinic rays, use may be made of various mercury lamps, carbon arc lamps, xenon lamps or ultraviolet fluorescent lamps. After the irradiation, the photosensitive resin plate is developed with water, a lower alcohol or a mixture thereof to dissolve out the unexposed areas. Thus, a relief having a clear image is obtained.

The printing relief obtained from the composition of the present invention is transparent, and has an image possessing a sharp contour. In addition, the printing relief exhibits excellent solvent resistance, printing durability and flexibility. The photosensitive plate of the present invention can be effectively utilized in producing not only a printing plate, but also, various decorative, building or electrical materials or parts.

The present invention will be illustrated in more detail by the following examples.

EXAMPLE 1

50 parts by weight of an equi-molar salt of an α,ω-diaminopolyoxyethylene and adipic acid, the α,ω-diaminopolyoxyethylene being prepared by adding acrylonitrile to a polyethylene glycol having a number average molecular weight of 400 at both ends thereof and by reducing the nitrile group with hydrogen, 30 parts by weight of ε-caprolactam and 20 parts by weight of an equi-molar salt of hexamethylenediamine and adipic acid, were melt-polymerized under conventional conditions to prepare a polyamide having a relative viscosity of 2.28, as measured by a method in which a solution of 1 g of the polymer dissolved in 100 ml of chloral hydrate was used at a temperature of 25° C. and which method was applied to another examples, and an ether linkage concentration O/N in the main chain of 1.55.

55 parts by weight of the above-mentioned polyamide, 35 parts by weight of a reaction product of diglycidyl ether of ethylene glycol and methacrylic acid, 3 parts by weight of triethanolamine, 5 parts by weight of diethylene glycol, 1 part by weight of benzoin methyl ether, 1 part by weight of triphenylphosphine and 0.3 part by weight of hydroquinone monomethyl ether were dissolved in methyl alcohol to prepare a solution.

The solution was cast on a polyester film having a thickness of 0.2 mm which was coated with an adhesive on the surface thereof. The resultant polyester film was dried at a temperature of 50° C. to prepare a transparent photosensitive plate having a photosensitive layer having a thickness of 0.8 mm.

A negative film was tightly superposed on the photosensitive plate and the plate was exposed through the film to the rays from a 2 KW ultra-high pressure mercury lamp at a distance of 65 cm for two minutes. The exposed plate was rubbed in neutral water, at a temperature of 30° C., for 1.5 minutes, by using a commercially available brush type developing machine, thereby to remove the unexposed areas from the plate. Thus, a printing plate, on which an image of the negative film was accurately and sharply reproduced, and which exhibited excellent flexibility and flatness, was obtained. After the printing plate was dried, it was set on a relief printing machine and the machine was operated. As a result, a clear print was obtained in which the delicate lines and fine half tone dots of the original were accurately reproduced. Also, the printing plate exhibited excellent printing durability.

Comparative Example 1

A copolymerized polyamide having a relative viscosity of 2.20 and an O/N of 0.43 was prepared according to the same procedures as those described in Example 1, except that instead of the $\alpha,\omega$-diaminopolyoxyethylene prepared from the polyethylene glycol having a number average molecular weight of 400 as used in Example 1, an equi-molar salt of 1.2-bis($\gamma$-aminopropoxy) ethane and adipic acid was used, said 1.2-bis($\gamma$-aminopropoxy) ethane being prepared by adding acrylonitrile to ethylene glycol at both hydroxyl groups thereof and by reducing the nitrile group with hydrogen.

A printing plate was prepared according to the same procedures as those described in Example 1 using the resultant polyamide. The resultant printing plate was unsatisfactory with respect to transparency, flexibility and toughness for practical purposes.

Comparative Example 2

A polyamide having a relative viscosity of 2.31 and an O/N of 2.30 was prepared according to the same procedures as those described in Example 1, except that a polyethylene glycol having a number average molecular weight of 2,000 was used instead of the polyethylene glycol having a number average molecular weight of 400.

A printing plate was prepared according to the same procedures as those described in Example 1 using the resultant polyamide. The resultant printing plate exhibited poor transparency and printing durability.

Comparative Example 3

85 parts by weight of an equi-molar salt of an $\alpha,\omega$-diaminopolyoxyethylene and adipic acid, said $\alpha,\omega$-diaminopolyoxyethylene being prepared from a polyethylene glycol having a number average molecular weight of 400 according to the same procedure as that described in Example 1, 10 parts by weight of $\epsilon$-caprolactam and 5 parts by weight of an equi-molar salt of hexamethylenediamine and adipic acid were melt-polymerized to prepare a polyamide having a relative viscosity of 2.09 and an O/N of 3.92.

A photosensitive plate was prepared according to the same procedures as those described in Example 1 using the resultant polyamide. Then, after the photosensitive plate was subjected to an exposing operation under the same conditions as those described in Example 1, the exposed plate was developed with neutral water. In this case, the exposed plate exhibited good developability. However, the resultant printing plate exhibited poor printing durability and, thus, was unsuitable as a practical printing plate.

EXAMPLE 2

50 parts by weight of an equi-molar salt of an $\alpha,\omega$-diaminopolyoxyethylene and adipic acid, said $\alpha,\omega$-diaminopolyoxyethylene being prepared by aminating both ends of a polyethylene glycol having a number average molecular weight of 1,000 according to the same procedure as that described in Example 1, 25 parts by weight of $\epsilon$-caprolactam and 25 parts by weight of an equi-molar salt of hexamethylenediamine and adipic acid were melt-polymerized under conventional conditions to prepare a polyamide having a relative viscosity of 2.36 and an O/N of 2.05.

55 parts by weight of the above-mentioned polyamide, 15 parts by weight of a reaction product of m-xylylenediamine and glycidyl methacrylate, 20 parts by weight of 2-oxyethyl methacrylate, 3 parts by weight of triethanolamine, 5 parts by weight of diethylene glycol, 2 parts by weight of benzoyl isopropyl ether, 0.2 part by weight of t-butyl catechol and 0.05 part by weight of ascorbic acid were dissolved in a mixture consisting of 90 parts by weight of ethyl alcohol and 10 parts by weight of water to prepare a solution. The resultant solution was cast on a glass plate. After the glass plate was dried, the dried layer was separated from the glass plate to obtain a photosensitive resin sheet. The resultant photosensitive resin sheet was hot-pressed on a polyester film having a thickness of 0.2 mm, which was coated with an adhesive on the surface thereof, thereby to prepare a photosensitive plate.

A negative film was tightly superposed on the photosensitive plate and the plate was exposed through the film to the rays from a commercially available chemical lamp exposing apparatus for 4 minutes. The exposed plate was developed by spraying neutral water at a temperature of 30° C. onto the exposed surface under a pressure of 3 kg/cm$^2$ for 3 minutes, thereby to remove the unexposed areas from the plate. Thus, a printing plate was obtained, on which an image of the negative film was accurately and sharply reproduced, and which exhibited excellent flexibility and flatness.

EXAMPLE 3

50 parts by weight of an equi-molar salt of an $\alpha,\omega$-diaminopolyoxyethylene and adipic acid, said $\alpha,\omega$-diaminopolyoxyethylene being prepared by aminating both ends of a polyethylene glycol having a number average molecular weight of 200 according to the same procedure as that described in Example 1, and 50 parts by weight of $\epsilon$-caprolactam were melt-polymerized under conventional conditions to prepare a polyamide having a relative viscosity of 2.30 and an O/N of 1.17.

60 parts by weight of the above-mentioned polyamide was dissolved in a mixture consisting of 80 parts by weight of ethyl alcohol and 20 parts by weight of water. Then, 28 parts by weight of a reaction product of m-xylylenediamine and glycidyl methacrylate, 5 parts by weight of chloro-2-oxypropyl methacrylate, 3 parts by weight of methylenebisacrylamide, 3 parts by weight of benzophenone, 1 part by weight of triphenylphosphine and 0.02 part by weight of phenothiazine were added to the above-prepared solution. The resultant solution was cast in the form of a sheet and the cast sheet was dried at a temperature of 60° C. to obtain a photosensitive resin composition.

An iron plate having a thickness of 0.3 mm and an adhesive layer applied thereon, the above photosensitive resin composition and a cover film consisting of a polyester film having a thickness of 0.1 mm were superposed in that order. The superposed layers were hot-pressed to prepare a photosensitive plate having a total thickness of 0.9 mm.

The cover film was separated from the photosensitive plate and a negative film was tightly superposed on the plate. The plate was then exposed through the film to the rays from a 2 KW ultra-high pressure mercury lamp, at a distance of 65 cm, for 2 minutes. The exposed plate was developed by spraying neutral water at a temperature of 30° C. onto the exposed surface under a pressure of 3 kg/cm$^2$ for 3 minutes, thereby to remove the unexposed areas from the plate. Thus, a printing plate was obtained, on which lines of an image of the negative film were accurately reproduced so as to form a relief having a sharp head portion.

EXAMPLE 4

50 parts by weight of an equi-molar salt of an α,ω-dicarboxypolyoxyethylene and hexamethylenediamine, said α,ω-dicarboxypolyoxyethylene being prepared by adding acrylonitrile to a polyethylene glycol having a number average molecular weight of 400 at both ends thereof and by hydrolyzing the nitrile group, 30 parts by weight of ε-caprolactam and 20 parts by weight of an equi-molar salt of hexamethylenediamine and edipic acid were melt-polymerized to prepare a polyamide having a relatively viscosity of 2.36 and an O/N of 1.64.

A printing plate was prepared according to the same procedures as those described in Example 1 using the above-prepared polyamide. The resulting printing plate exhibited excellent neutral water-developability, flexibility, toughness and printing durability. Thus, the printing plate was very effective for practical use.

EXAMPLES 5 THROUGH 7

In each example of Examples 5 through 7, a printing plate was prepared according to the same procedures as those described in Example 1 except that the composition of a polyamide and the type of a photopolymerizable unsaturated compound were those as indicated in Table 1. In the case where a copolymerized polyamide containing 30 to 70% by weight of a polyether segment having a number average molecular weight of from 150 to 1,500, which consisted of a structural unit derived from a polyoxyethylene and an aliphatic dicarboxylic or diamine was used, all of the resulting photosensitive plates exhibited excellent neutral water-developability. In addition, the resultant printing plates all exhibited excellent flexibility, toughness, flatness and printing durability. Thus, these printing plates were very effective for practical use.

TABLE 1

| Example | | 5 | 6 | 7 |
|---|---|---|---|---|
| Molecular weight of polyethylene glycol | | 400 | 400 | 800 |
| Composition of polyamide[a] | | PGDA . 6/6/PACM . 6 50/20/30 | PGDA . 6/6/6 . I 40/40/20 | PGDA . 6/6/66/6 . SIP 45/25/20/10 |
| Relative viscosity of polyamide | | 2.58 | 2.09 | 2.19 |
| O/N of polyamide | | 1.78 | 1.15 | 1.73 |
| Photosensitive resin composition[b] | Polyamide 55 | parts by weight | | |
| | EGMA 35 | parts by weight | " | " |
| | TEA 3 | parts by weight | | |
| | DEG 5 | parts by weight | | |
| | BME 1 | parts by weight | | |
| | TPP 1 | parts by weight | | |
| | HQME 0.3 | parts by weight | | |
| Property of printing plate | Transparency | Excellent | Excellent | Excellent |
| | Water-developability | Excellent | Excellent | Excellent |
| | Flexibility | Excellent | Excellent | Excellent |
| | Flatness | Excellent | Excellent | Excellent |
| | Toughness | Excellent | Excellent | Excellent |
| | Printing durability | Excellent | Excellent | Excellent |

[a]PGDA . 6: An equi-molar salt of an α,ω-diaminopolyoxyethyle and adipic acid, 6: ε-caprolactam, 66: an equi-molar salt of hexamethylenediamine and adipic acid, PACM . 6: an equi-molar salt of bis(4,4'-aminocyclohexyl) methane and adipic acid, 6 . I: an equi-molar salt of hexamethylenediamine and isophthalic acid, 6 . SIP: an equi-molar salt of hexamethylenediamine and 5-sodium sulfoisophthalic acid.
[b]EGMA: a reaction product of diglycidyl ether of ethylene glycol and methacrylic acid, TEA: triethanolamine, DEG: diethylene glycol, BME: benzoin methyl ether, TPP: triphenylphosphine, HQME: hydroquinone monomethyl ether.

EXAMPLE 8

50 parts by weight of an equimolar salt of an α,ω-diaminopoly(oxyethylene/oxypropylene) and adipic acid, said α,ω-diaminopoly(oxyethylene/oxypropylene) being prepared by aminating both ends of a poly(ethylene/propylene) glycol having a number average molecular weight of 600 and a content of oxyethylene unit of 60% by mole, 25 parts by weight of ε-caprolactam and 25 parts by weight of an equi-molar salt of hexamethylenediamine and adipic acid were melt-polymerized to prepare a polyamide having a relative viscosity of 2.36 and a polyether segment content in the main chain of 36.9% by weight.

Then, 55 parts by weight of the above-mentioned polyamide, 15 parts by weight of a reaction product of meta-xylylenediamine and glycidyl methacrylate, 20 parts by weight of 2oxyethyl methacrylate, 3 parts by weight of triethanolamine, 5 parts by weight of diethylene glycol, 2 parts by weight of benzoin isopropyl ether, 0.2 part by weight of t-butyl catechol and 0.05 part by weight of ascorbic acid were dissolved in a mixture consisting of 90 parts by weight of ethyl alcohol and 10 parts by weight of water, so as to prepare a solution having a concentration of 65%. The resultant solution was cast on a glass plate. After the glass plate was dried, the dried layer was separated from the plate to obtain a photosensitive resin sheet. Then, the photosensitive resin sheet was hot-pressed on a polyester film having a thickness of 0.2 mm and an adhesive layer applied thereon to prepare a photosensitive plate.

Thereafter, a negative film was tightly superposed on the photosensitive plate. Then, the plate was exposed through the film to the rays from a commercially available chemical lamp exposing apparatus for 4 minutes. The exposed plate was developed by spraying neutral water at a temperature of 30° C. onto the exposed surface under a pressure of 3 kg/cm² for 3 minutes, thereby to remove the unexposed areas from the plate. Thus, a printing plate was obtained, on which a line image of the negative film were accurately and clearly reproduced, and which exhibited excellent flexibility and flatness.

EXAMPLE 9

60 parts by weight of an equi-molar salt of an α,ω-dicarboxypoly(oxyethylene/oxypropylene) and hexamethylenediamine, the α,ω-dicarboxypoly(oxyethylene/oxypropylene) being prepared by adding acrylonitrile to both ends of a poly(ethylene/propylene) glycol having a number average molecular weight of 900 and a content of oxyethylene unit of 70% by mole, and by hydrolyzing the nitrile group, and 40 parts by weight of ε-caprolactam were melt-polymerized under conventional conditions to prepare a polyamide having a relative viscosity of 2.19 and a polyether segment content in the main chain of 47.4% by weight.

Then, 60 parts by weight of the above-mentioned polyamide, 28 parts by weight of a reaction product of methaxylenediamine and glycidyl methacrylate, 5 parts by weight of chloro-2-oxypropyl methacrylate, 3 parts by weight of methylenebisacrylamide, 3 parts by weight of benzophenone, 1 part by weight of triphenylphosphine and 0.02 part by weight of phenothiazine were dissolved in a mixture consisting of 80 parts by weight of ethyl alcohol and 20 parts by weight of water, so as to prepare a solution having a concentration of 65%.

The resultant solution was cast in the form of a sheet and the cast sheet was dried at a temperature of 60° C. to obtain a photosensitive resin sheet. Then, the photosensitive resin sheet was superposed on an iron plate having a thickness of 0.3 mm and an adhesive layer applied thereon, and thereafter, a cover film consisting of a polyester film having a thickness of 0.1 mm was further superposed on the photosensitive resin sheet. The superposed layers were hot-pressed to obtain a photosensitive plate having a total thickness of 0.9 mm.

Thereafter, the cover film was separated from the photosensitive plate and a negative film was tightly superposed on the plate. The plate was then exposed through the film to the rays from a 2 KW ultra-high pressure mercury lamp at a distance of 65 cm for 2 minutes. The exposed plate was developed by spraying neutral water at a temperature of 30° C. onto the exposed surface under a pressure of 3 kg/cm² for 3 minutes, thereby to remove the unexposed areas from the plate. Thus, a clear printing plate was obtained on which lines of an image of the negative film were accurately reproduced so as to form a relief having a sharp head.

EXAMPLES 10 THROUGH 13

In each of Examples 10 through 13, a printing plate was prepared according to the same procedures as those described in Example 1, except that the polyamide had a composition as indicated in Table 2. All of the resultant photosensitive plates exhibited excellent alcohol- and water-developability. In addition, the resultant printing plates all exhibited excellent flexibility, toughness, flatness and printing durability. Thus, these printing plates were very effective for practical use.

TABLE 2

| Example | | 10 | 11 | 12 | 13 |
|---|---|---|---|---|---|
| Type of polyalkylene glycol[a] | | PEG/PPG | " | " | " |
| Molecular weight of polyalkylene glycol | | 900 | 600 | " | " |
| Composition of polyamide[b] | | PGDA . 6/6/66 45/30/25 | PGDA . 6/6 . 1 50/30/20 | PGDA 6/6/PACM . 6 55/30/15 | PGDA . 6/6/66/6 . SIP 45/25/20/10 |
| Relative viscosity of polyamide | | 2.44 | 2.20 | 2.31 | 2.36 |
| Content of polyether segment (% by weight) | | 36.7 | 36.6 | 39.9 | 33.2 |
| Photosensitive resin composition[c] | Polyamide 55 parts by weight | | | | |
| | EGMA 35 parts by weight | | | | |
| | TEA 3 parts by weight | | | | |
| | DEG 5 parts by weight | " | " | " | " |
| | BME 1 parts by weight | | | | |
| | TPP 1 parts by weight | | | | |
| | HQME 0.3 parts by weight | | | | |
| Properties of printing plate | Transparency | Excellent | Excellent | Excellent | Excellent |
| | Developing solution | Ethyl alcohol/water :80/20 (by weight) | Neutral water | Neutral water | Neutral Water |
| | Developability | Excellent | Excellent | Excellent | Excellent |
| | Flexibility | Excellent | Excellent | Excellent | Excellent |
| | Flatness | Excellent | Excellent | Excellent | Excellent |
| | Toughness | Excellent | Excellent | Excellent | Excellent |
| | Printing durability | Excellent | Excellent | Excellent | Excellent |

[a]PEG/PPG: poly(ethylene/propylene) glycol (a content of oxyethylene unit: 70% by mole)
[b]PGDA 6: an equi-molar salt of an α, ω-diaminopolyoxyalkylene and adipic acid, other abbreviated words are the same as defined in Table 1.
[c]Abbreviated words are the same as defined in Table 1.

We claim:

1. A photosensitive polyamide resin composition comprising a polyamide containing 10 to 70% by weight of a polyoxyethylene segment or poly(oxyethylene/oxypropylene) copolymer segment having a number average molecular weight of from 150 to 1,500 in its molecular chain and from 5 to 200% by weight based on the weight of the polyamide of a photopolymerizable unsaturated compound.

2. A photosensitive polyamide resin composition as claimed in claim 1, wherein the number average molecular weight of the polyoxyethylene segment or the poly(oxyethylene/oxypropylene) copolymer segment is in the range of from 180 to 1,200.

3. A photosensitive polyamide resin composition as claimed in claim 1, wherein the content of the polyoxyethylene segment of poly(oxyethylene/oxypropylene) copolymer segment in the polyamide is in the range of from 40 to 70% by weight.

4. A photosensitive resin composition as claimed in claim 1, 2 or 3 wherein the content of the oxyethylene unit in the copolymer segment is at least 50% by mole.

5. A photosensitive resin composition as claimed in claim 1, wherein the ratio of the number of oxygen atoms forming ether linkages to the number of nitrogen atoms forming the main chain of the polyamide is greater than 1.0.

* * * * *